US011705441B2

(12) United States Patent
Sun et al.

(10) Patent No.: US 11,705,441 B2
(45) Date of Patent: Jul. 18, 2023

(54) MANUFACTURING METHOD OF MICRO LED DISPLAY DEVICE

(71) Applicant: PlayNitride Display Co., Ltd., MiaoLi County (TW)

(72) Inventors: Sheng-Yuan Sun, MiaoLi County (TW); Ying-Tsang Liu, MiaoLi County (TW); Yi-Ching Chen, MiaoLi County (TW); Pei-Hsin Chen, MiaoLi County (TW); Yi-Chun Shih, MiaoLi County (TW); Tzu-Yang Lin, MiaoLi County (TW); Yu-Hung Lai, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 137 days.

(21) Appl. No.: 17/359,679

(22) Filed: Jun. 28, 2021

(65) Prior Publication Data

US 2021/0327858 A1 Oct. 21, 2021

Related U.S. Application Data

(62) Division of application No. 16/677,672, filed on Nov. 8, 2019, now Pat. No. 11,094,677.

(30) Foreign Application Priority Data

Dec. 5, 2018 (TW) .................................. 107143614

(51) Int. Cl.
*H01L 25/075* (2006.01)
*H01L 27/15* (2006.01)

(52) U.S. Cl.
CPC ........ *H01L 25/0753* (2013.01); *H01L 25/075* (2013.01); *H01L 27/153* (2013.01); *H01L 27/156* (2013.01)

(58) Field of Classification Search
CPC . H01L 25/075; H01L 25/0753; H01L 27/153; H01L 27/156
USPC ...................................... 257/88, 89
See application file for complete search history.

(56) References Cited

U.S. PATENT DOCUMENTS

2016/0371047 A1* 12/2016 Cope ..................... H01L 33/20
2018/0261582 A1* 9/2018 Henry .................... H01L 33/62
2019/0371229 A1* 12/2019 Wang .................... H01L 33/387
2021/0091052 A1* 3/2021 Schuele ................. H01L 24/81

FOREIGN PATENT DOCUMENTS

CN 109378365 A * 2/2019 ............... G09F 9/33
WO WO-2016100662 A1 * 6/2016 ......... H01L 21/6835

* cited by examiner

*Primary Examiner* — Matthew E Warren
(74) *Attorney, Agent, or Firm* — JCIPRNET

(57) ABSTRACT

A micro LED display device including a display substrate, a plurality of conductive pad pairs and a plurality of micro light emitting elements is provided. The display substrate has a first arranging area, a splicing area connected to the first arranging area, and a second arranging area connected to the splicing area, wherein the splicing area is located between the first arranging area and the second arranging area. The conductive pad pairs are disposed on the display substrate in an array with the same pitch. The micro light emitting elements are disposed on the display substrate and are electrically bonded to the conductive pad pairs. A manufacturing method of the micro LED display device is also provided.

3 Claims, 14 Drawing Sheets

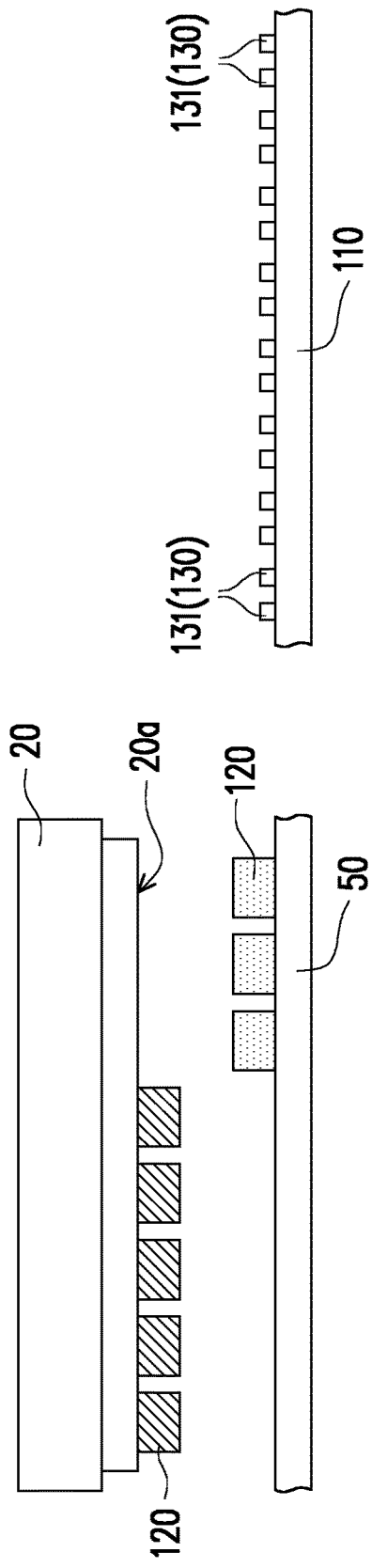
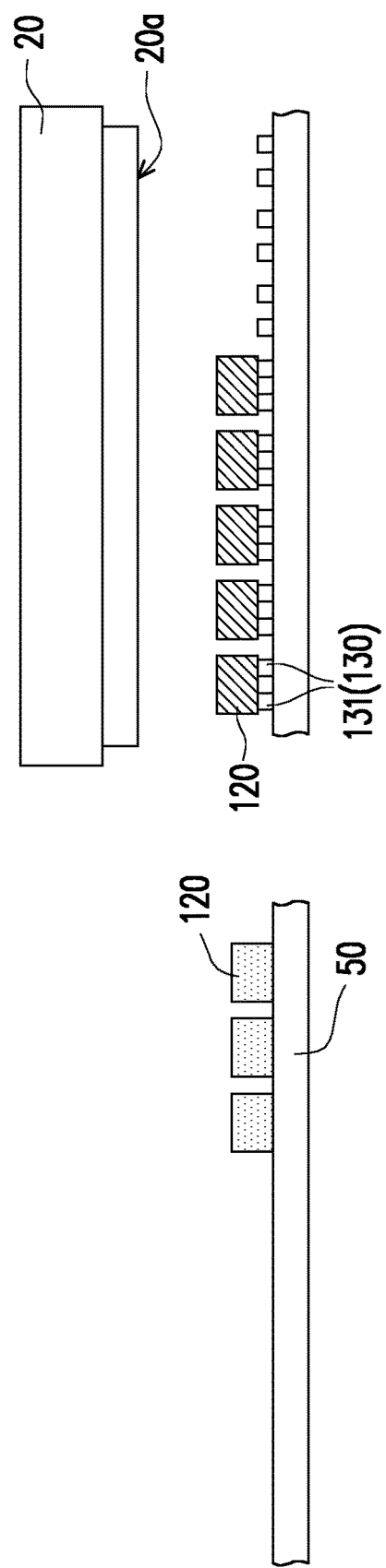
FIG. 2A
FIG. 2B

MANUFACTURING METHOD OF MICRO LED DISPLAY DEVICE

CROSS-REFERENCE TO RELATED APPLICATION

This application is a divisional application of and claims the priority benefit of U.S. application Ser. No. 16/677,672, filed on Nov. 8, 2019, now allowed, which claims the priority benefit of Taiwan patent application serial no. 107143614, filed on Dec. 5, 2018. The entirety of each of the above-mentioned patent applications is hereby incorporated by reference herein and made a part of specification.

BACKGROUND

Technical Field

The disclosure relates to a display device, and particularly relates to a micro Light-Emitting Diode (LED) display device and a manufacturing method thereof.

Description of Related Art

Along with development of display technology, since micro LEDs may meet the requirements of thinning, miniaturization and arraying of products, and have advantages of high luminescence efficiency, high brightness, high contrast value, good reliability and faster response time, etc., relevant manufacturers are all optimistic about prospects of this new generation of display technology and actively invest in development and research of such display technology.

During a process of transferring the micro LEDs formed on a growth substrate to a display substrate, the required micro LEDs are hundreds of thousands or millions of pieces. The common transfer mode is, for example, to pick up the micro LEDs from the growth substrate through magnetic attraction or electrostatic adsorption, and to place the micro LEDs to the display substrate. In each of transfer procedures, the number of the micro LEDs picked up by a transfer element is fixed and the micro LEDs are arranged in an array. Therefore, the micro LEDs transferred to the display substrate may be roughly divided into several rectangular regions, and due to a process error probably occurred in transfer procedure or a photoelectric characteristic difference in adjacent two transfer regions, light field distributions of the micro LEDs in any two adjacent rectangular regions probably have a difference. Therefore, when the display substrate operates, a viewer probably perceives an obvious boundary existed between any two adjacent rectangular regions, which results in a problem of poor display quality.

SUMMARY

The disclosure is directed to a micro LED display device and a manufacturing method thereof, which has good display quality.

The disclosure provides a micro LED display device including a display substrate, a plurality of conductive pad pairs and a plurality of micro light-emitting elements. The display substrate has a first arranging area, a splicing area connected to the first arranging area, and a second arranging area connected to the splicing area, wherein the splicing area is located between the first arranging area and the second arranging area. The splicing area has a plurality of first filling positions and a plurality of second filling positions. The first filling positions and the second filling positions are arranged alternatively in an arranging direction. The conductive pad pairs are disposed in the first arranging area, the splicing area and the second arranging area of the display substrate in an array with the same pitch, wherein each of the first filling positions and each of the second filling positions of the splicing area are respectively configured with at least one of the conductive pad pairs. The micro light-emitting elements are disposed on the display substrate and are electrically bonded to the conductive pad pairs. In the splicing area, the micro light-emitting elements disposed in the first filling position and the second filling position have different offsets with respect to the conductive pad pairs bonded thereto.

In an embodiment of the disclosure, the micro light-emitting elements disposed in the first filling positions and the first arranging area have the same offset with respect to the conductive pad pairs bonded thereto, and the micro light-emitting elements disposed in the second filling positions and the second arranging area have the same offset with respect to the conductive pad pairs bonded thereto.

In an embodiment of the disclosure, the first filling positions and the second filling positions are arranged alternatively in another arranging direction.

In an embodiment of the disclosure, each of the conductive pad pairs has an N-type pad and a P-type pad separated from each other and a reference line perpendicular to the display substrate, and the reference line passes through a middle point between the N-type pad and the P-type pad.

In an embodiment of the disclosure, a sidewall of each of the light-emitting elements and the reference line of the corresponding conductive pad pair are spaced by a distance, and the distance is the offset.

In an embodiment of the disclosure, a length of the light-emitting elements is smaller than 100 μm.

In an embodiment of the disclosure, an interval between two micro light-emitting elements in any two adjacent first filling positions along the arraigning direction in the splicing area is different to an interval between two micro light-emitting elements in any two adjacent first filling position and second filling position.

In an embodiment of the disclosure, an interval between two adjacent micro light-emitting elements respectively in the first arranging area and the first filling position of the splicing area is different to an interval between two adjacent micro light-emitting elements respectively in the first arranging area and the second filling position of the splicing area.

In an embodiment of the disclosure, in the arranging direction of the display substrate, the two adjacent second filling positions are separated by at least one of the first filling positions, and the two adjacent first filling positions are separated by at least one of the second filling positions.

In an embodiment of the disclosure, the number of the first filling positions in the arranging direction on the display substrate is equal to the number of the second filling positions in the arranging direction on the display substrate, and the first filling positions and the second filling positions adopt a random distribution.

In an embodiment of the disclosure, the first filling positions are symmetrically distributed along a middle line of the splicing area.

In an embodiment of the disclosure, the splicing area adopts a multi-column distribution, wherein the number of the first filling positions in each column of the splicing area is gradually decreased towards a direction away from the first arranging area.

The disclosure provides a micro LED display device including a display substrate, a plurality of conductive pad pairs and a plurality of micro light-emitting elements. The display substrate has a first arranging area, a splicing area connected to the first arranging area, and a second arranging area connected to the splicing area, wherein the splicing area is located between the first arranging area and the second arranging area, and the splicing area has a plurality of first filling positions and a plurality of second filling positions, and the first filling positions and the second filling positions are arranged alternatively in an arranging direction. The conductive pad pairs are disposed on the display substrate and are distributed in the first arranging area, the splicing area and the second arranging area in an array in groups. Each of the first filling positions and each of the second filling positions in the splicing area are respectively configured with three conductive pad pairs. The micro light-emitting elements are disposed on the display substrate and are electrically bonded to the conductive pad pairs. The micro light-emitting elements include a plurality of first color LEDs, a plurality of second color LEDs and a plurality of third color LEDs, each of the first filling positions and each of the second filling positions are respectively configured with one of the first color LEDs, one of the second color LEDs and one of the third color LEDs at the three conductive pad pairs, and the first color LEDs disposed in the first filling position and the second filling position have different offsets with respect to the conductive pad pairs bonded thereto.

In an embodiment of the disclosure, the first color LEDs disposed in the first filling position and the first arranging area have the same offset with respect to the conductive pad pairs bonded thereto, and the first color LEDs disposed in the second filling position and the second arranging area have the same offset with respect to the conductive pad pairs bonded thereto.

In an embodiment of the disclosure, an interval between the first color LED in one of the two adjacent first filling positions and the first color LED in the other one of the two adjacent first filling positions adjacent along the arranging direction in the splicing area is different to an interval between the first color LED in one of the first filling positions and the first color LED in the second filling position adjacent to the first filling position.

In an embodiment of the disclosure, an interval between two adjacent first color LEDs respectively in the first arranging area and the first filling position of the splicing area is different to an interval between two adjacent first color LEDs respectively in the first arranging area and the second filling position of the splicing area.

The disclosure provides a manufacturing method of a micro LED display device including following steps. First, a display substrate is provided, wherein the display substrate includes a plurality of conductive pad pairs arranged in an array. Then, a carrier is provided, wherein the carrier is configured with a plurality of micro light-emitting elements. Then, a transfer element is provided. Thereafter, the micro light-emitting elements are transferred from the carrier to the display substrate through the transfer element, and the micro light-emitting elements are electrically bonded to the conductive pad pairs. Further, in an $n^{th}$ transferring step, the transfer element is aligned with the carrier, and the transfer element generates a first pattern transfer area to transfer a first part of the micro light-emitting elements in a region of the carrier to the display substrate according to the first pattern transfer area, and retain a second part of the micro light-emitting elements in the region, and define a plurality of vacancy positions in a splicing area of the display substrate within a range corresponding to the region. In another transferring step, the transfer element is aligned with the carrier, and the transfer element generates a second pattern transfer area to transfer a plurality of the micro light-emitting elements to the display substrate according to the second pattern transfer area to fill the vacancy positions defined in the $n^{th}$ of transfer, wherein n is a positive integer greater than or equal to 1.

In an embodiment of the disclosure, each of the conductive pad pairs has a reference line perpendicular to the display substrate. A sidewall of each of the micro light-emitting elements transferred to the display substrate in the $n^{th}$ transferring step and the reference line of the corresponding conductive pad pair are spaced by a first distance, and a sidewall of each of the micro light-emitting elements transferred to the display substrate in another transferring step and the reference line of the corresponding conductive pad pair are spaced by a second distance, wherein the second distance is different to the first distance.

In an embodiment of the disclosure, the first pattern transfer area is matched with the second pattern transfer area.

Based on the above description, in the manufacturing method of the micro LED display device of the disclosure, a transfer force is generated at a partial area of the transfer element to transfer the micro light-emitting elements with a specific number and distribution pattern, and a peripheral of the micro light-emitting elements in a prior transfer procedure is configured with vacancy positions for the micro light-emitting elements in a posterior transfer procedure to fill in. Therefore, the splicing area between any two adjacent arranging areas on the display substrate have the micro light-emitting elements with two different offsets. When the micro LED display device operates, the splicing area may provide a blurring effect, such that the splicing area between any two adjacent arranging areas would not produce an obvious boundary, so as to improve the display quality of the micro LED display device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 2A to FIG. 2D are side views of a manufacturing flow of the micro LED display device of FIG. 1A.

DESCRIPTION OF THE EMBODIMENTS

Figure 1A:
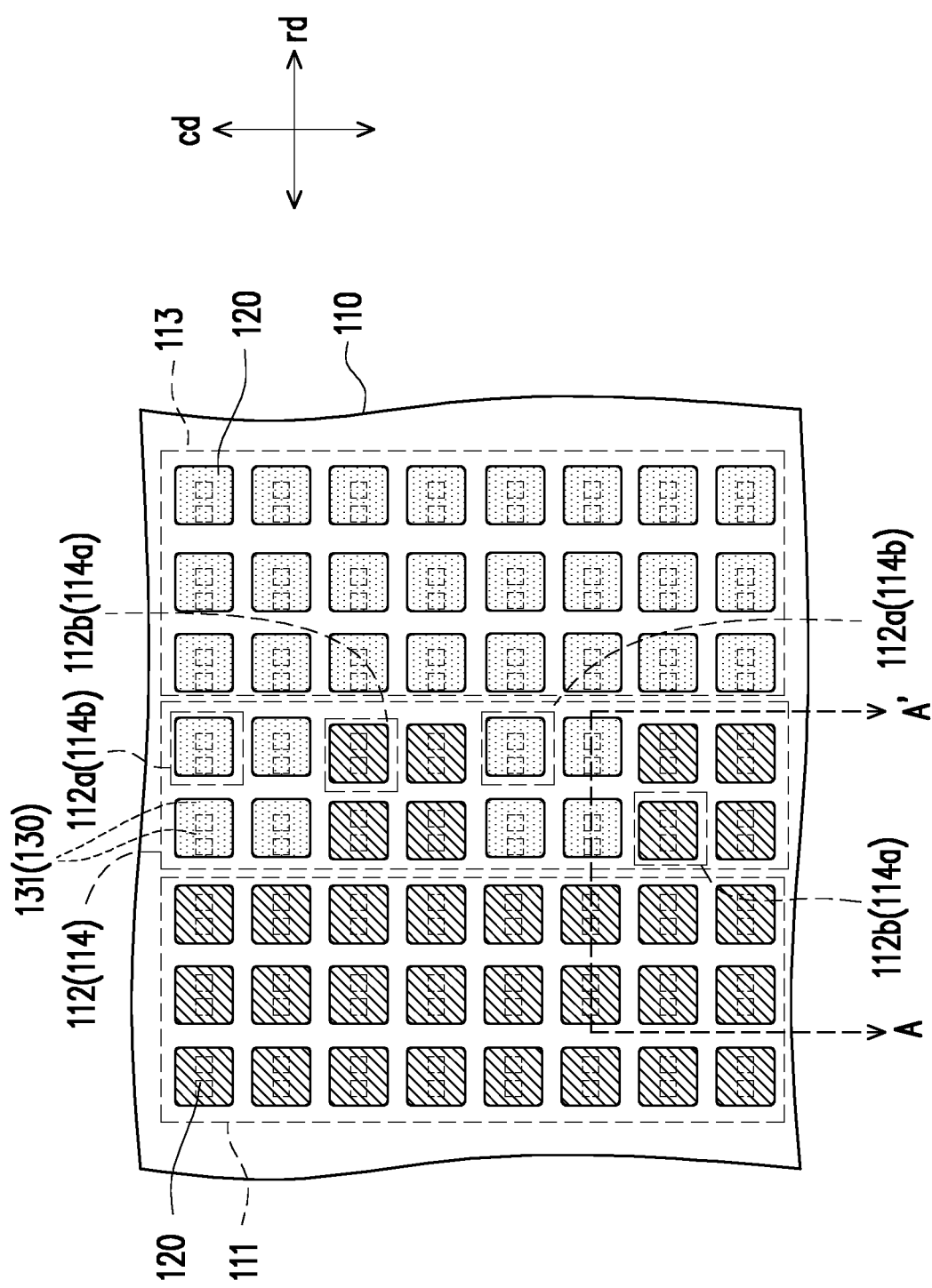
FIG. 1A is a partial top view of a display substrate according to a first embodiment of the disclosure.
Figure 1B:
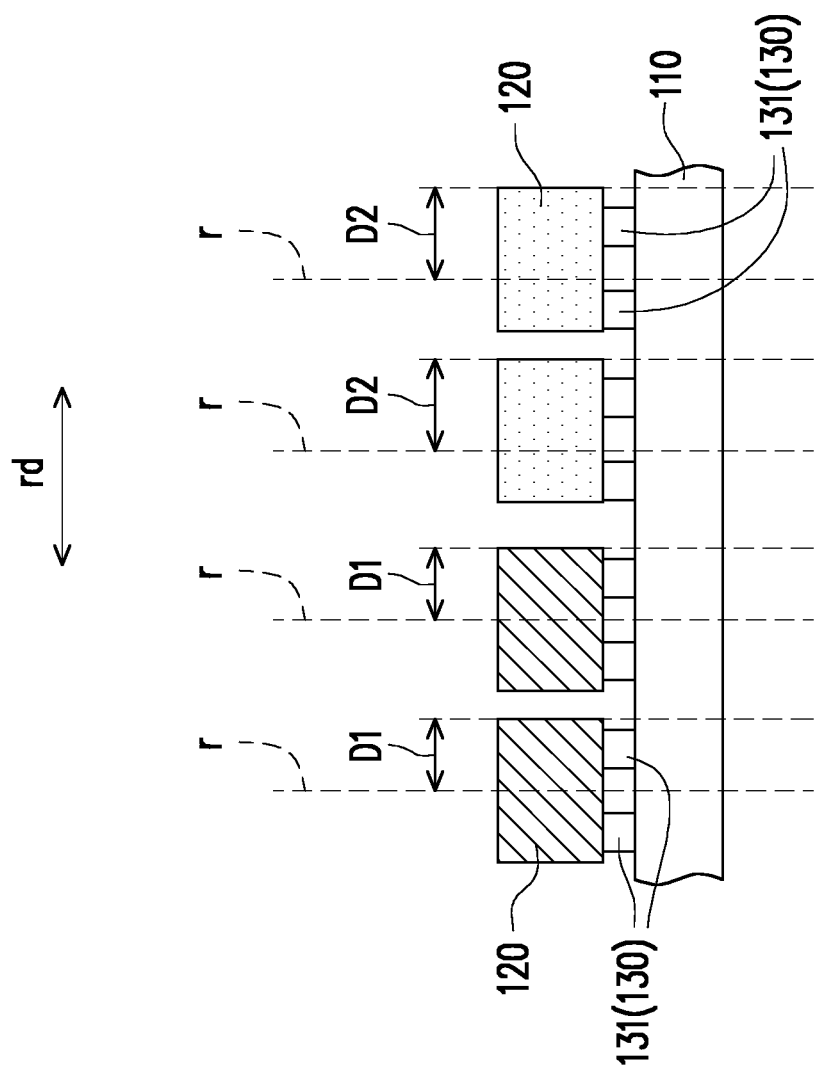
FIG. 1B is a partial cross-sectional view of FIG. 1A along a section line A-A'.
Figure 2C:
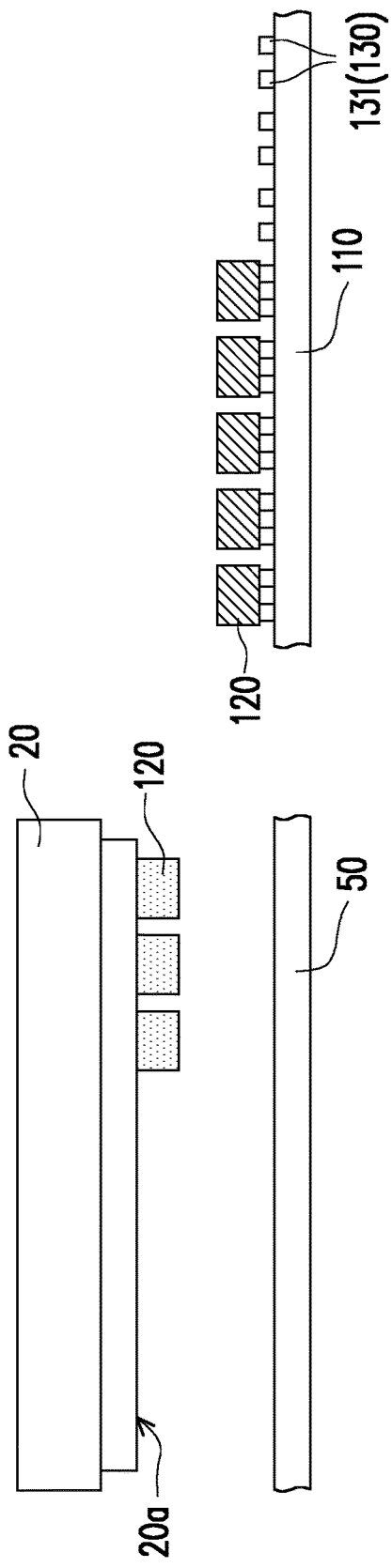
Figure 2D:
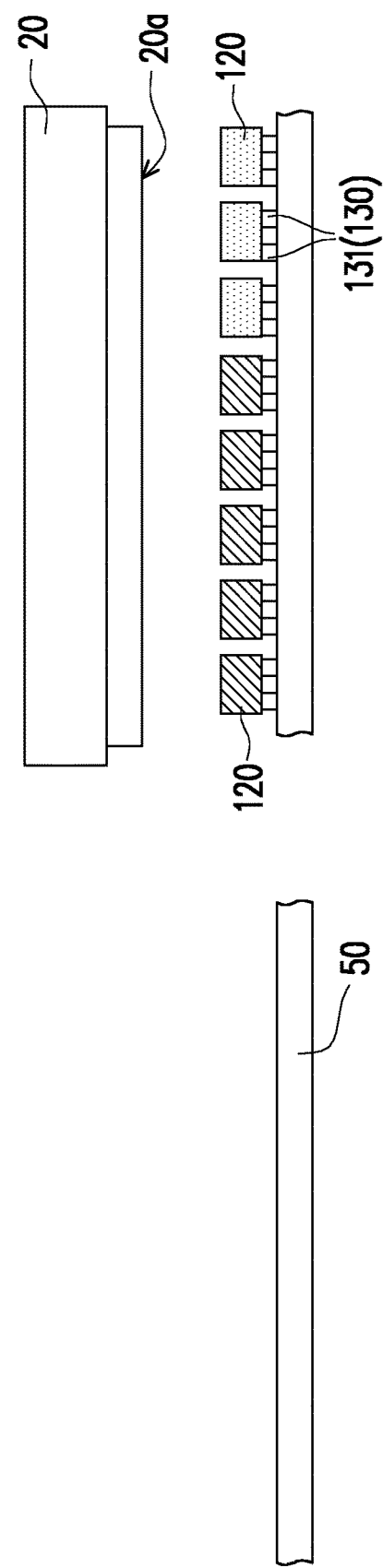

FIG. 1A is a partial top view of a display substrate according to a first embodiment of the disclosure. FIG. 1B is a partial cross-sectional view of FIG. 1A along a section line A-A'. Referring to FIG. 1A and FIG. 1B, in the embodiment, a micro LED display device 100 includes a display substrate 110, a plurality of micro light-emitting elements 120 and a plurality of conductive pad pairs 130, wherein the micro light-emitting elements 120 are arranged in an array and electrically bonded to the conductive pad pairs 130 for being fixed to the display substrate 110 and electrically connected to the display substrate 110. In other words, the conductive pad pairs 130 disposed on the display substrate 110 are also arranged in an array. The micro light-emitting elements 120 are micro light-emitting diodes (LEDs) with lengths generally smaller than 100 μm and thickness smaller than 10 μm.

The display substrate 110 is roughly divided into a first arranging area 111, a first sub-splicing area 112 connected to the first arranging area 111, a second arranging area 113 and a second sub-splicing area 114 connected to the second arranging area 113. As shown in FIG. 1A, the first sub-splicing area 112 and the second sub-splicing area 114 are overlapped with each other to form a splicing area located between the first arranging area 111 and the second arranging area 113. Further, according to arranging directions of the conductive pad pairs 130 and the micro light-emitting element 120, the display substrate 110 has a column direction cd and a row direction rd perpendicular with each other. The first sub-splicing area 112 is configured with a plurality of first vacancy positions 112a and a plurality of first filling positions 112b in the column direction cd of the display substrate 110, and the second sub-splicing area 114 is configured with a plurality of second vacancy positions 114a and a plurality of second filling positions 114b in the column direction cd of the display substrate 110. The micro light-emitting elements 120 in the first filling positions 112b and the first arranging area 111 are transferred and bonded to the display substrate 110 at the same time, and the micro light-emitting elements 120 in the second filling positions 114b and the second arranging area 113 are transferred and bonded to the display substrate 110 at the same time. The transferring and bonding steps will be described in the subsequent content for manufacturing process, and detail thereof is not introduced herein.

Regarding the first sub-splicing area 112, an offset of each of the micro light-emitting elements 120 in the first filling position 112b with respect to the corresponding conductive pad pair 130 in the row direction rd of the display substrate 110 is equal to an offset of each of the micro light-emitting elements 120 in the first arranging area 111 with respect to the corresponding conductive pad pair 130 in the row direction rd of the display substrate 110. Regarding the second sub-splicing area 114, an offset of each of the micro light-emitting elements 120 in the second filling positions 114b with respect to the corresponding conductive pad pair 130 in the row direction rd of the display substrate 110 is equal to an offset of each of the micro light-emitting elements 120 in the second arranging area 113 with respect to the corresponding conductive pad pair 130 in the row direction rd of the display substrate 110. Namely, the offset of each of the micro light-emitting elements 120 in the first filling position 112b with respect to the corresponding conductive pad pair 130 in the row direction rd of the display substrate 110 is different to the offset of each of the micro light-emitting elements 120 in the second filling positions 114b with respect to the corresponding conductive pad pair 130 in the row direction rd of the display substrate 110. In other words, as shown in FIG. 1A, an interval between the micro light-emitting element 120 in the first filling position 112b in the splicing area 112 and the micro light-emitting element 120 adjacent thereto in the first arranging area 111 is the same with an interval between any two adjacent micro light-emitting elements 120 in the first arranging area 111, and an interval between the micro light-emitting elements 120 in the second filling position 114b and the micro light-emitting element 120 adjacent thereto in the second arranging area 113 is the same with an interval between any two adjacent micro light-emitting elements 120 in the second arranging area 113.

In the embodiment, the first sub-splicing area 112 and the second sub-splicing area 114 are overlapped with each other, wherein the first vacancy positions 112a are filled by the second filling positions 114b, and the second vacancy positions 114a are filled by the first filling positions 112b. On the other hand, the first filling positions 112b are separated by at least one second filling position 114b in the column direction cd of the display substrate 110. The second filling positions 114b are separated by at least one first filling position 112b in the column direction cd of the display substrate 110. Further, the first sub-splicing area 112 and the second sub-splicing area 114 are overlapped with each other to construct a splicing area, and the first arranging area 111 is spliced to the second arranging area 113 through the said splicing area. In the said splicing area, the second filling positions 114b and the first filling positions 112b are arranged alternatively in the column direction cd of the display substrate 110, and the number of the second filling positions 114b is equal to the number of the first filling positions 112b. In other embodiments, the number of the second filling positions may be not equal to the number of the first filling positions.

Based on the design that the offset of each of the micro light-emitting elements 120 in the second filling positions 114b with respect to the corresponding conductive pad pair 130 in the row direction rd of the display substrate 110 is different to the offset of each of the micro light-emitting elements 120 in the first filling position 112b with respect to the corresponding conductive pad pair 130 in the row direction rd of the display substrate 110, and the first filling positions 112b and the second filling positions 114b are arranged alternatively, a light field of each of the micro light-emitting elements 120 in the second filling positions 114b is mixing with a light field of each of the micro light-emitting elements 120 in the first filling position 112b to blur boundary effect between process steps (e.g. transferring process) or chips variation (e.g. wavelength distribution within wafer). When the micro LED display device 100 shows image, the splicing area between the first arranging area 111 and the second arranging area 113 would not have an obvious boundary, so as to improve the display quality of the micro LED display device 100.

In the embodiment, each of the conductive pad pairs 130 has two separated conductive pads 131, and one of the two conductive pads is an N-type pad, and the other one is a P-type pad. As shown in FIG. 1B, in the cross-sectional view, a virtual line passing through a middle point of the conductive pads 131 configured in pairs and perpendicular to the display substrate 110 is a reference line r of each of the conductive pad pairs 130. On the other hand, as shown in FIG. 1A, at least one of the conductive pad pairs 130 is configured in the second filling positions 114b. Similarly, the first filling positions 112b are also configured with at least one of the conductive pad pairs 130.

The offset of each of the micro light-emitting elements 120 in different areas with respect to the corresponding conductive pad pair 130 in the row direction rd is described below.

To be specific, a sidewall of each of the light-emitting elements 120 in the first arranging area 111 and the reference line r of the corresponding conductive pad pair 130 are spaced by a first distance D1. Since the offset of the micro light-emitting elements 120 in each of the first filling positions 112b with respect to the corresponding conductive pad pair 130 in the row direction rd is equal to the offset of each of the micro light-emitting elements 120 in the first arranging area 111 with respect to the corresponding conductive pad pair 130 in the row direction rd, it is deduced that the sidewall of the micro light light-emitting element 120 in each of the first filling positions 112b and the reference line r of the corresponding conductive pad pair 130 are also spaced by the first distance D1.

On the other hand, a sidewall of the light-emitting elements 120 in each of the second filling positions 114b and the reference line r of the corresponding conductive pad pair 130 are spaced by a second distance D2. The sidewall of each of the micro light light-emitting element 120 in the second arranging area 113 and the reference line r of the corresponding conductive pad pair 130 are also spaced by the second distance D2. In the embodiment, the second distance D2 is different to the first distance D1.

Further, the offset of the micro light-emitting element 120 in each of the second filling positions 114b with respect to the corresponding conductive pad pair 130 in the row direction rd of the display substrate 110 is different to the offset of the micro light-emitting elements 120 in each of the first filling positions 112b with respect to the corresponding conductive pad pair 130 in the row direction rd of the display substrate 110. Therefore, an interval between the micro light-emitting elements 120 in any two adjacent first filling positions 112b along the row direction rd in the splicing area is different to an interval between the micro light-emitting elements 120 in any adjacent first filling position 112b and second filling position 114b. On the other hand, an interval between two adjacent micro light-emitting elements 120 respectively in the first arranging area 111 and the first filling position 112b of the splicing area is different to an interval between two adjacent micro light-emitting elements 120 respectively in the first arranging area 111 and the second filling position 114b of the splicing area.

The interval difference mentioned above is due to that the micro light-emitting elements 120 in the first arranging area 111 and the first filling position 112b are transferred in a same transferring step, and the micro light-emitting elements 120 in the second arranging area 113 and the second filling position 114b are transferred in another transferring step. Moreover, the micro light-emitting elements 120 may include red micro LEDs, blue micro LEDs, green micro LEDs, white micro LEDs or a combination of the above LEDs.

A manufacturing process of the micro LED display device 100 is described below.

Figure 3A:
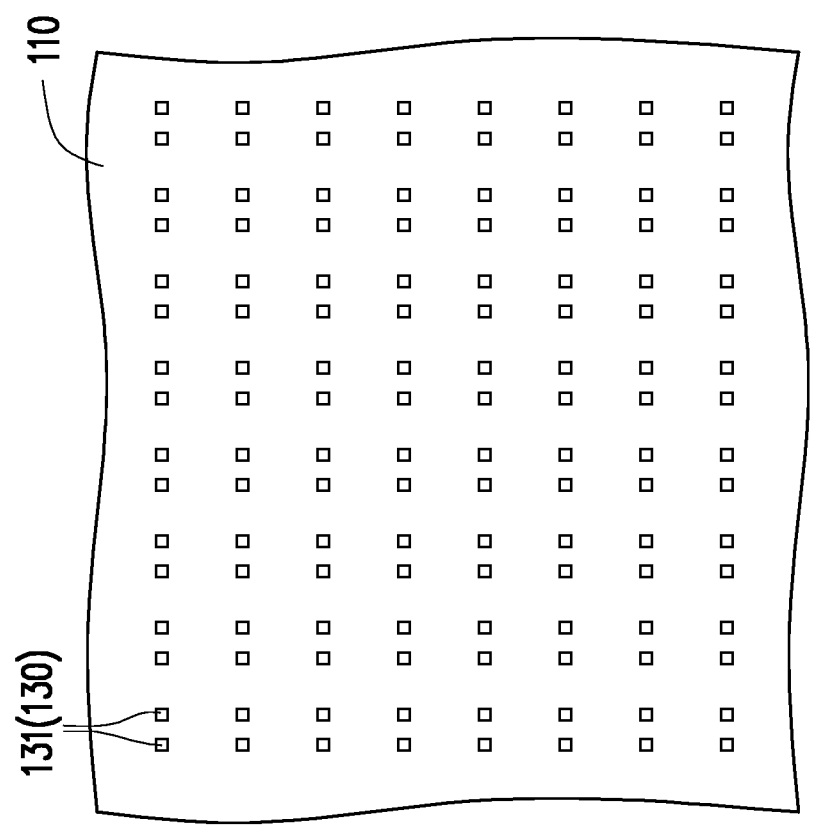
FIG. 3A is a partial top view of a carrier and a display substrate of FIG. 2A, and illustrates a state that micro light-emitting elements on the carrier are still not picked up.
Figure 3A:
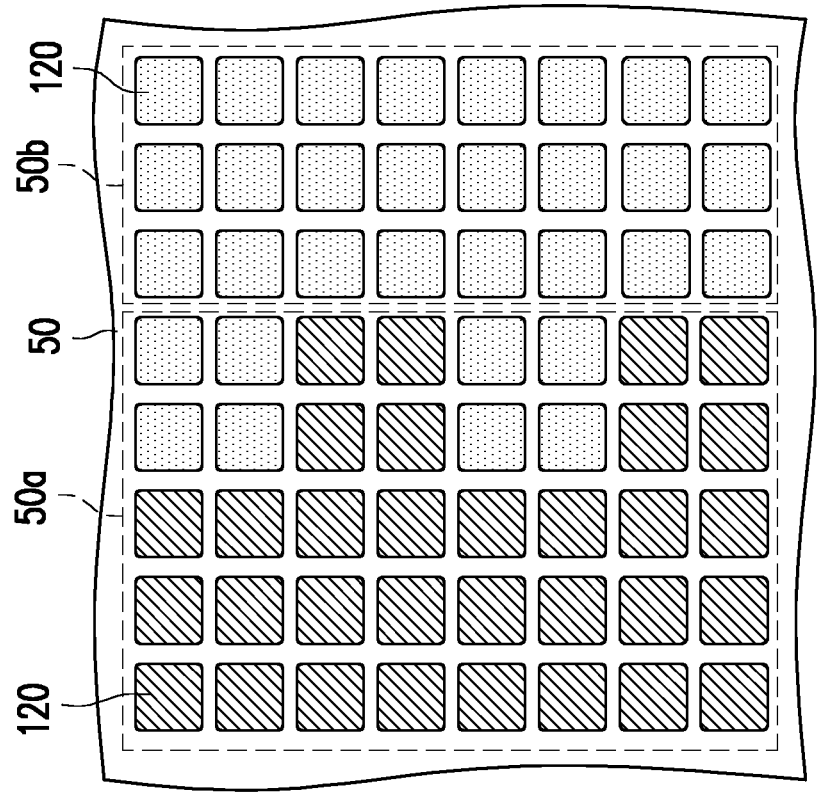
Figure 3B:
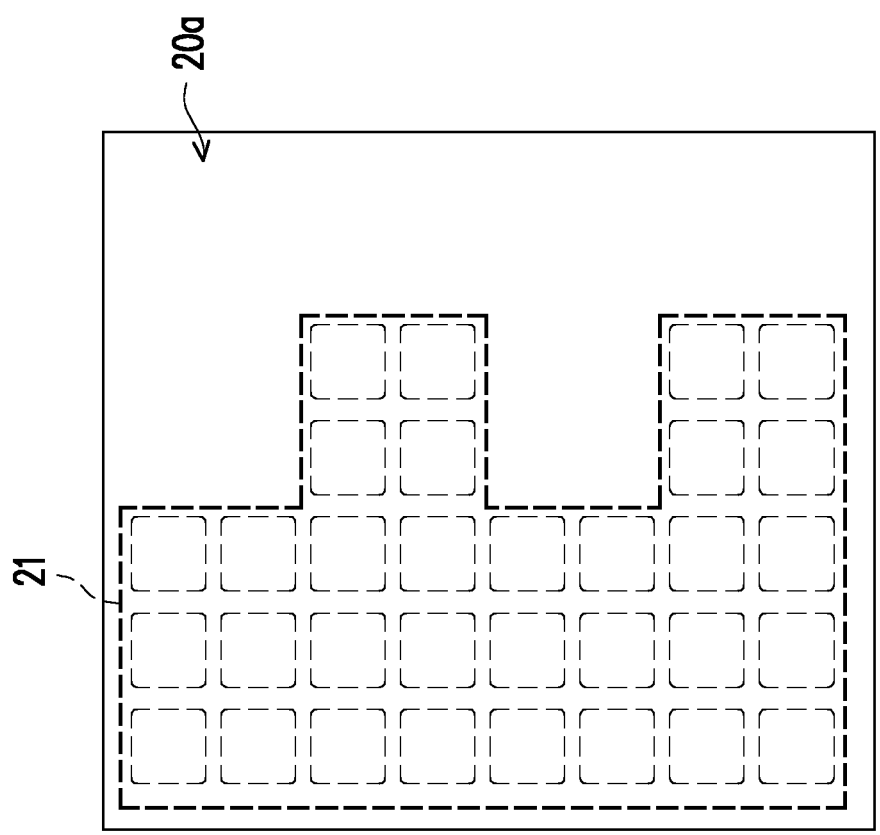
FIG. 3B is a schematic diagram of a transfer surface of a transfer element of FIG. 2A.
Figure 3C:
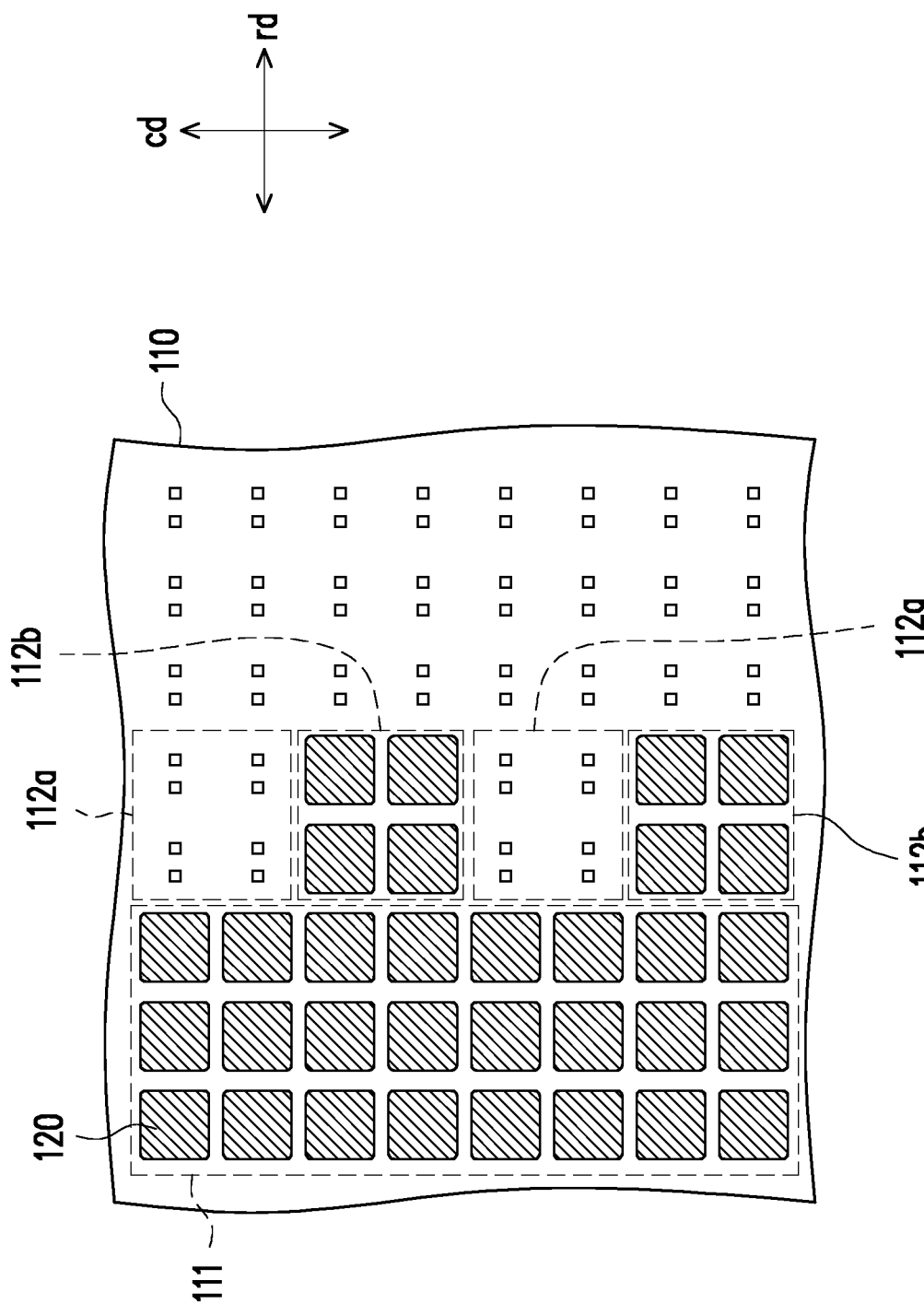
FIG. 3C is a partial top view of the display substrate of FIG. 2B.
Figure 3D:
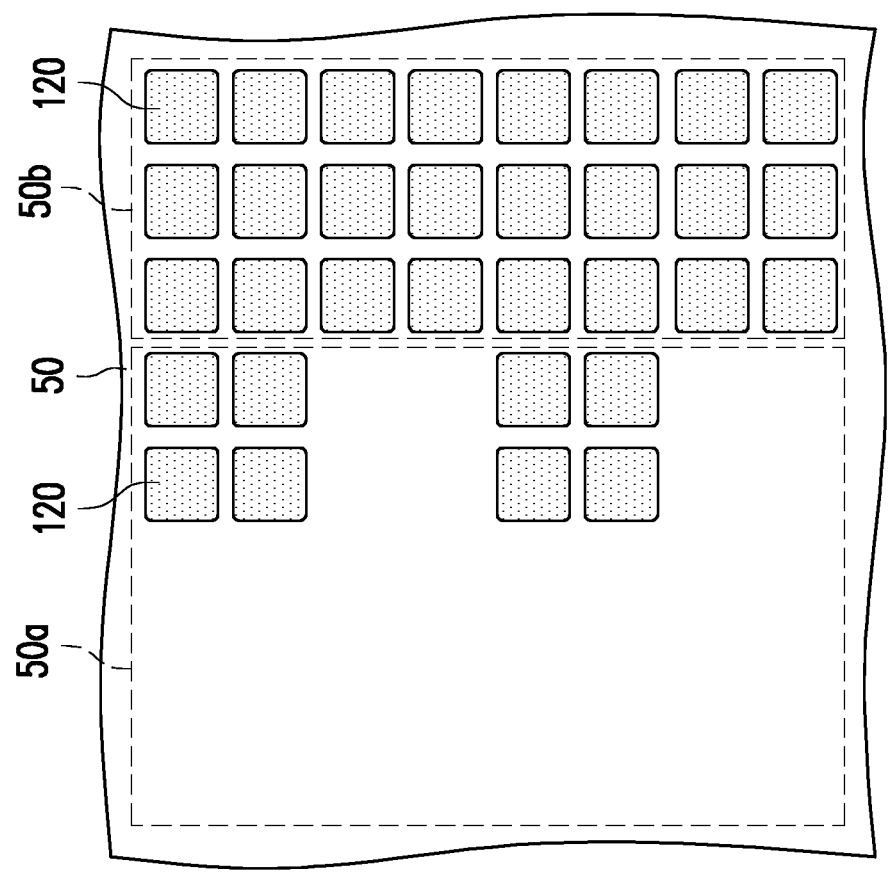
FIG. 3D is a partial top view of the carrier of FIG. 2C.
Figure 3E:
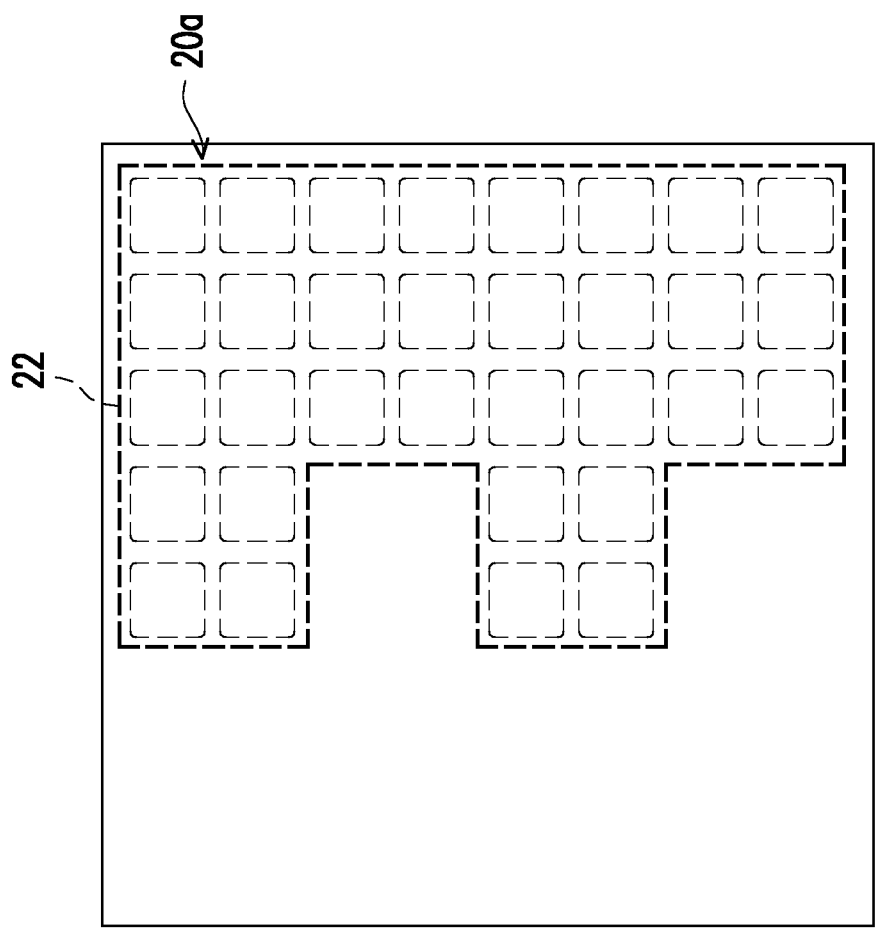
FIG. 3E is a schematic diagram of the transfer surface of the transfer element of FIG. 2C.

FIG. 2A to FIG. 2D are side views of a manufacturing flow of the micro LED display device of FIG. 1A. FIG. 3A is a partial top view of a carrier and the display substrate of FIG. 2A, and illustrates a state that the micro light-emitting elements on the carrier are still not picked up. FIG. 3B is a schematic diagram of a transfer surface of a transfer element of FIG. 2A. FIG. 3C is a partial top view of the display substrate of FIG. 2B. FIG. 3D is a partial top view of the carrier of FIG. 2C. FIG. 3E is a schematic diagram of the transfer surface of the transfer element of FIG. 2C. First, referring to FIG. 2A to FIG. 2B, and FIG. 3A to FIG. 3C, the display substrate 110 is provided, wherein the display substrate 110 is, for example, an array substrate, and includes a plurality of conductive pad pairs 131 arranged in an array to serve as electrical contacts of the micro light-emitting elements 120 subsequently transferred to the display panel 110. Then, a carrier 50 is provided, wherein the carrier 50 is, for example, a glass substrate, a semiconductor substrate, a sapphire substrate or a temporary carrier, and is configured with a plurality of micro light-emitting elements 120 arranged in an array. Then, a transfer element 20 is adopted to transfer the micro light-emitting elements 120 on the carrier 50 to the display substrate 110. Further, the transfer element 20 may be moved between the carrier 50 and the display substrate 110, and moved vertically with respect to the carrier 50 and the display substrate 110. On the other hand, the transfer element 20 has a transfer surface 20a capable of generating a transfer force, and the transfer force may be a magnetic attraction force, a viscous force or an electrostatic adsorption force. According to a size of the transfer surface 20a of the transfer element 20, the carrier 50 may be divided into a plurality of transfer-pending areas with sizes equal to or close to the size of the transfer surface 20a, and FIG. 3A schematically illustrates a first transfer-pending area 50a and a second transfer-pending area 50b adjacent to each other on the carrier 50.

When one of the transfer procedures is carried out, the transfer element 20 is moved to the position above the carrier 50, and the transfer surface 20a is aligned with the first transfer-pending area 50a. In order to obtain a splicing configuration of the micro light-emitting elements 120 in the micro LED display device 100 shown in FIG. 1A, only a partial region of the transfer surface 20a of the transfer element 20 generates the transfer force (as shown in FIG. 3B), so as to pick up a first part of the micro light-emitting elements 120 in the first transfer-pending area 50a. Now, the region that generates the transfer force on the transfer surface 20a of the transfer element 20 defines a first pattern transfer area 21, and the micro light-emitting elements 120 in a corresponding region on the carrier 50 are picked up and removed from the carrier 50.

Further, not only the operation of the transfer element 20 are controlled by a controller (not shown), but the generation and distribution of the transfer force of the transfer surface 20a thereof are controlled by the controller (not shown). For example, the controller (not shown) may include a processing chip, or a Central Processing Unit (CPU), or other programmable general purpose or special purpose microprocessor, a Digital Signal Processor (DSP), a programmable controller, an Application Specific Integrated Circuits (ASIC), a Programmable Logic Device (PLD), other similar processing circuit or a combination of the above devices.

On the other hand, the controller (not shown) may further include an inbuilt or external memory device, for example, a Dynamic Random Access Memory (DRAM), a flash memory or a Non-Volatile Random Access Memory (NVRAM), etc., to save size information of the carrier 50, size information of the display substrate 110, quantity and arranging information of the conductive pad pairs 130, quantity and arranging information of the micro light-emitting elements 120, moving route information between the carrier 50 and the display substrate 110, transfer force distribution information (or referred to as transfer pattern information) of the transfer surface 20a of the transfer element 20 or other required information or parameters. On the other hand, the memory device may further save computation, processing or analysis modules for the manufacturing process of the micro LED display device of different implementation configurations.

As shown in FIG. 2B, after the transfer element 20 is moved to the position above the display substrate 110, the micro light-emitting elements 120 picked by the transfer element 20 are aligned with the conductive pad pairs 130 on the display substrate 110. Then, to electrically bond the micro light-emitting elements 120 to the conductive pad pairs 130. After the bonding process, the transfer element 20 is moved away from the display substrate 110. During the process that the transfer element 20 is moved away from the display substrate 110, the transfer element 20 stops generating the transfer force to prevent the micro light-emitting elements 120 being damaged by the transfer force.

As shown in FIG. 3C, after one of the transfer procedures, a region configured with the micro light-emitting elements 120 on the display substrate 110 may be corresponding to the first arranging area 111 and the first filling positions 112b shown in FIG. 1A. Besides, the other regions which are arranged alternatively with the first filling positions 112b in the column direction cd on the display substrate 110 and configured without the micro light-emitting elements 120 may be corresponding to the first vacancy positions 112a shown in FIG. 1A. In other embodiments, the first vacancy positions and the first filling positions may be arranged alternatively along the row direction of the display substrate.

Referring to FIG. 2C to FIG. 2D and FIG. 3D to FIG. 3E, during one of the transfer procedures, a second part of the micro light-emitting elements 120 is left in the first transfer-pending area 50a. After the transfer element 20 is moved back to the position above the carrier 50, a part of region of the transfer surface 20a of the transfer element 20 is aligned with the second part of the micro light-emitting elements 120 left in the first transfer-pending area 50a, and other part of region of the transfer surface 20a of the transfer element 20 is aligned with at least a part of the micro light-emitting elements 120 in the second transfer-pending area 50b. The controller (not shown) makes a partial region of the transfer surface 20a of the transfer element 20 to generate the transfer force to define a second pattern transfer area 22 according to arranging information of the second part of the micro light-emitting elements 120 left in the first transfer-pending area 50a and arranging information of the micro light-emitting elements 120 in the second transfer-pending area 50b, so as to pick up the second part of the micro light-emitting elements 120 left in the first transfer-pending area 50a and at least a part of the micro light-emitting elements 120 in the second transfer-pending area 50b to move away from the carrier 50.

The transfer element 20 is moved to the position above the display substrate 110 according to arranging information of the micro light-emitting elements 120 that have been transferred to the display substrate 110, and a part of the micro light-emitting elements 120 picked up by the transfer element 20 is aligned with the conductive pad pairs 130 in the first vacancy positions 112a, and the other part of the micro light-emitting elements 120 picked up by the transfer element 20 is aligned with the conductive pad pairs 130 besides the first vacancy positions 112a and the first filling positions 112b, wherein the micro light-emitting elements 120 aligned with the conductive pad pairs 130 in the first vacancy positions 112a are the second part of the micro light-emitting elements 120 left in the first transfer-pending area 50a. Then, the transfer element 20 is moved close to the display substrate 110 to electrically bond the micro light-emitting elements 120 to the conductive pad pairs 130. In other words, the transfer element 20 picks up the second part of the micro light-emitting elements 120 left in the first transfer-pending area 50a in one of the transfer procedures to fill the first vacancy positions 112a left on the display substrate 110 in one of the transfer procedures.

It should be noted that as shown in FIG. 3B and FIG. 3E, if a geometric contour (or referred to as an image) of the second pattern transfer area 22 is rotated by 180 degrees along a rotation axis (not shown) perpendicular to the transfer surface 20a, the rotated geometric contour (or image) of the second pattern transfer area 22 is completely overlapped with a geometric contour (or referred to as an image) of the first pattern transfer area 21. Moreover, a part of the geometric contour (or image) of the first pattern transfer area 21 has a first concave-convex side edge, and a part of the geometric contour (or image) of the second pattern transfer area 22 has a second concave-convex side edge. The second concave-convex side edge of the second pattern transfer area 22 will be fitted in a concave portion of the first concave-convex side edge of the first pattern transfer area 21, and a concave portion of the second concave-convex side edge of the second pattern transfer area 22 may be fitted in a convex portion of the first concave-convex side edge of the first pattern transfer area 21. In other words, the image of the second pattern transfer area 22 may be spliced to the image of the first pattern transfer area 21.

For example, since the image of the second pattern transfer area 22 rotated by 180 degrees may be completely overlapped with the image of the first pattern transfer area 21, the transfer element 20 is rotated by 180 degrees along the rotation axis (not shown) perpendicular to the transfer surface 20a and the first pattern transfer area 21 defined by the transfer force on the transfer surface 20a of the transfer element 20 may be still maintained the first pattern transfer area 21 when another one of the transfer procedures is carried out. Afterwards, the transfer element 20 is moved to the position above the carrier 50, and a part of region of the transfer surface 20a of the transfer element 20 is aligned with the second part of the micro light-emitting elements 120 left in the first transfer-pending area 50a, and other part of region of the transfer surface 20a of the transfer element 20 is aligned with at least a part of the micro light-emitting elements 120 in the second transfer-pending area 50b, such that the second part of the micro light-emitting elements 120 left in the first transfer-pending area 50a and at least a part of the micro light-emitting elements 120 in the second transfer-pending area 50b may be picked up and removed from the carrier 50.

In other embodiments, in response to a variation of a combination of the geometric contours (or images) of the first pattern transfer area and the second pattern transfer area, a part of the geometric contour (or image) of the second pattern transfer area may be rotated to fit a part of the geometric contour (or image) of the first pattern transfer area.

It should be noted that a distance between the sidewall of each of the micro light-emitting elements 120 in a prior transferring step (for example, a first transferring step) and the reference line r of the corresponding conductive pad pair 130 is different to a distance between the sidewall of each of the micro light-emitting elements 120 in a posterior transferring step (for example, a second transferring step) and the reference line r of the corresponding conductive pad pair 130.

It should be noted that only two transfer procedures are taken as an example for description in the above embodiment, and in other embodiments, the number of times of transferring to the micro light-emitting elements may be increased according to an actual application, and each transfer procedure has to refer to a previous transfer procedure for the transfer surface of the transfer element to generate a corresponding transfer force distribution (for example, a fifth transfer procedure has to refer to a fourth transfer procedure for the transfer surface of the transfer element to generate the corresponding transfer force distribution).

Through the above manufacturing procedure, the splicing area may be formed between any two adjacent display regions with different transfer procedures on the display substrate 110, and when the micro LED display apparatus 100 operates, the splicing area may provide the blurring effect, so as to improve the display quality of the micro LED display device 100.

Figure 4:
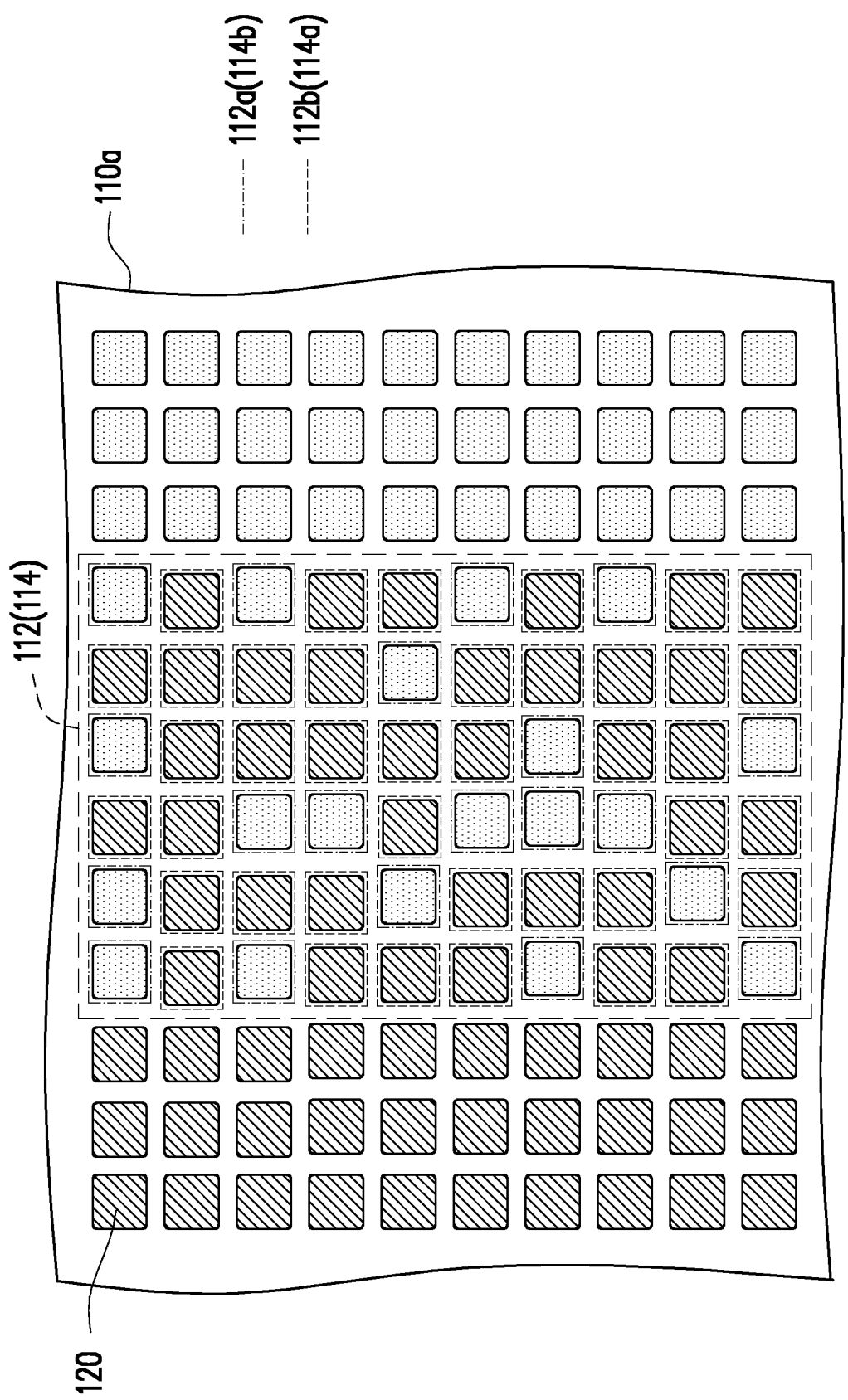
FIG. 4 is a partial top view of a display substrate according to a second embodiment of the disclosure.

FIG. 4 is a partial top view of a display substrate according to a second embodiment of the disclosure. Referring to FIG. 4, a main difference between the display substrate 110a of the embodiment and the display substrate 110 of the first embodiment lies in a structural type design of the splicing area. To be specific, in the embodiment, the first filling positions 112b and the second filling positions 114b in the splicing area are randomly distributed in each column.

Figure 5:
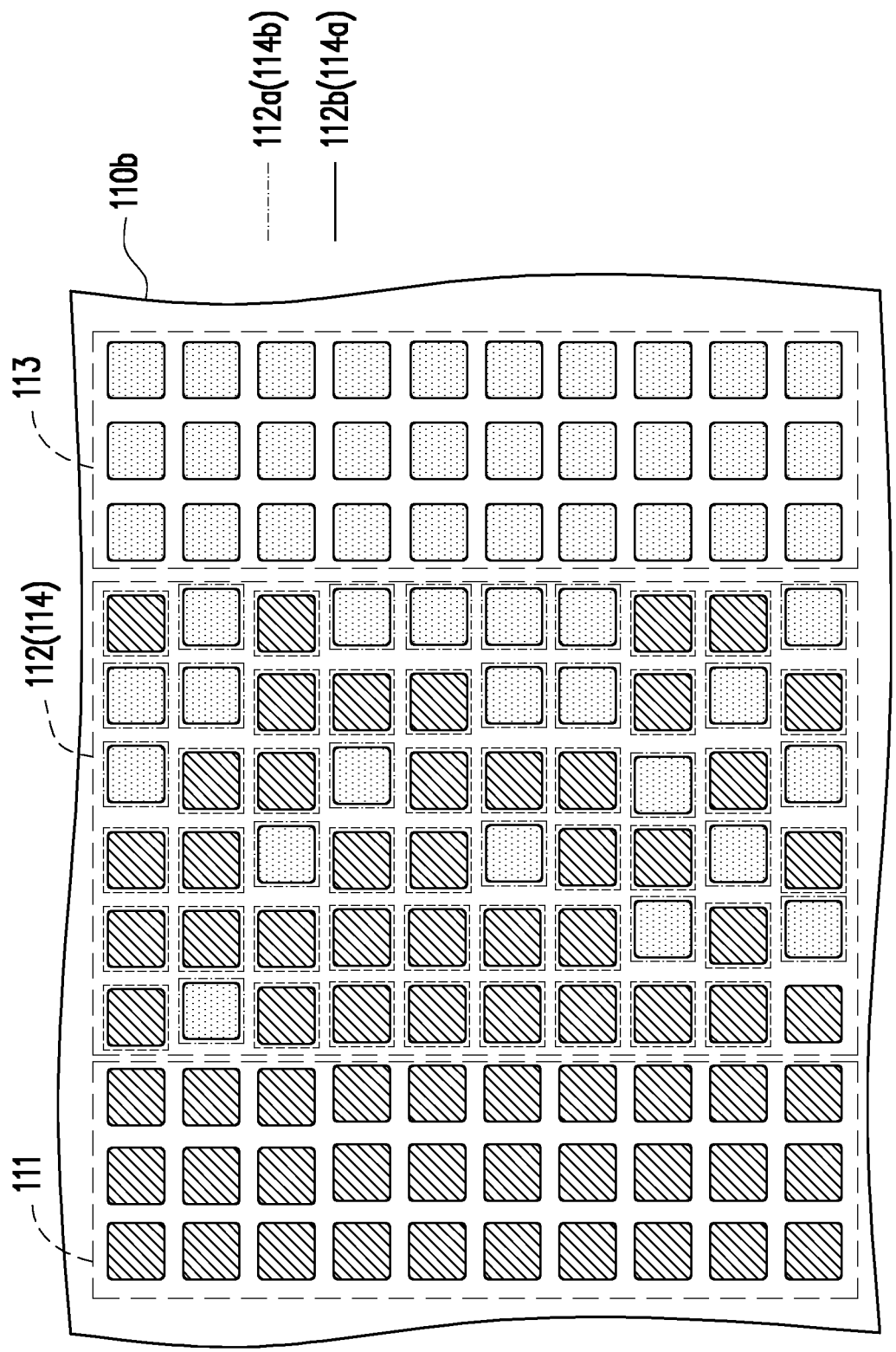
FIG. 5 is a partial top view of a display substrate according to a third embodiment of the disclosure.

FIG. 5 is a partial top view of a display substrate according to a third embodiment of the disclosure. Referring to FIG. 5, a main difference between the display substrate 110b of the embodiment and the display substrate 110 of the first embodiment lies in the arrangement of the first filling positions 112b and the second filling position 114b in the splicing area. To be specific, in the embodiment, the first sub-splicing area 112 and the second sub-splicing area 114 adopt a multi-column distribution, wherein each column of the first sub-splicing area 112 has at least one of the first vacancy positions 112a and at least one of the first filling positions 112b. On the other hand, each column of the second sub-splicing area 114 has at least one of the second vacancy positions 114a and at least one of the second filling position 114b. The first filling positions 112b are used for filling the second vacancy positions 114a, and the second filling positions 114b are used for filling the first vacancy positions 112a.

Therefore, the number of the first filling positions 112b in each column of the splicing area is gradually decreased from the first arranging area 111 towards the second arranging area 113. In other words, the number of the second filling positions 114b in each column is gradually increased in a direction away from the first arranging area 111. Namely, this design provides the blurring effect when the micro LED display device 100 operates, such that the splicing area of the first arranging area 111 and the second arranging area 113 would not have an obvious boundary.

Figure 6:
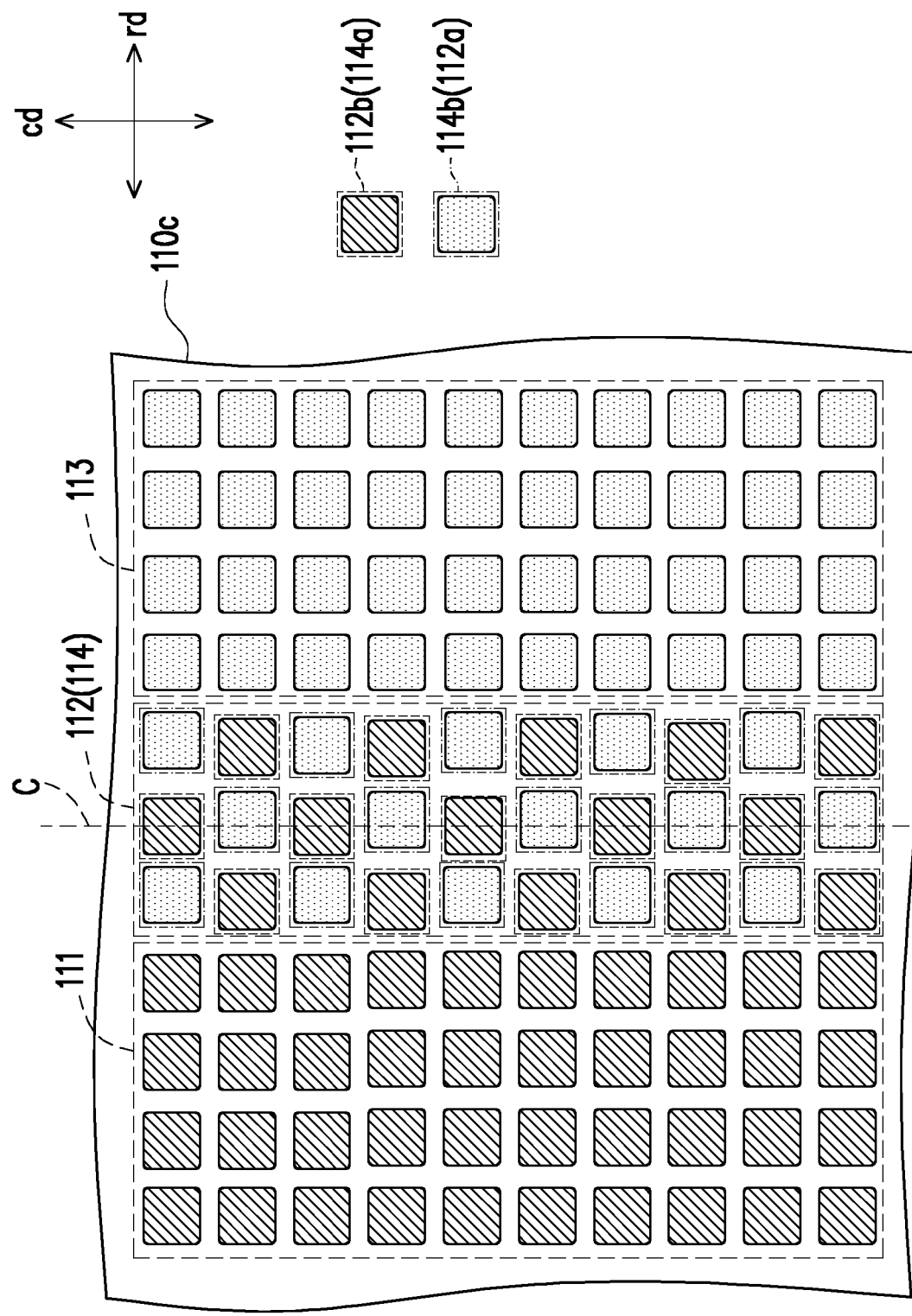
FIG. 6 is a partial top view of a display substrate according to a fourth embodiment of the disclosure.

FIG. 6 is a partial top view of a display substrate according to a fourth embodiment of the disclosure. Referring to FIG. 6, a main difference between the display substrate 110c of the embodiment and the display substrate 110 of the first embodiment lies in the arrangement of the first filling positions 112b and the second filling position 114b in the splicing area.

To be specific, the micro light-emitting elements 120 of the same column in the splicing area are respectively located in the first filling positions 112b and the second filling positions 114b, and in each column, the number of the first filling positions 112b is equal to the number of the second filling positions 114b.

In the embodiment, a middle line C of the splicing area is a central line parallel to the column direction cd of the display substrate 110c, wherein the first filling positions 112b or the second filling positions 114b are distributed symmetrically with respect to the central line C.

Based on pattern design of the splicing area of the embodiment, during the process of transferring the micro light-emitting elements 120, it is only required to rotate the transfer element to pick up the micro light-emitting elements on the carrier at different transferring steps, so as to improve manufacturing process efficiency.

Figure 7:
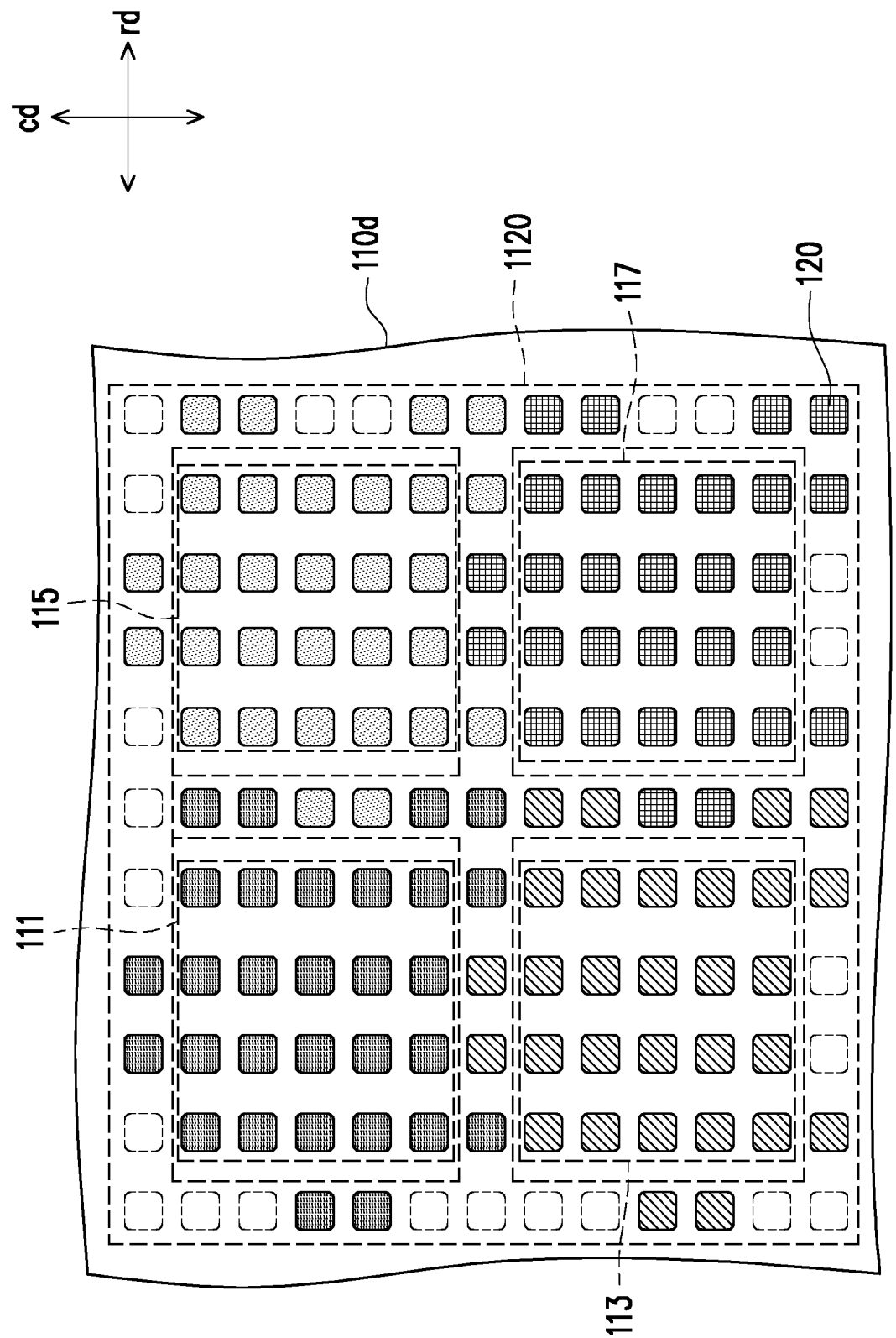
FIG. 7 is a partial top view of a display substrate according to a fifth embodiment of the disclosure.

FIG. 7 is a partial top view of a display substrate according to a fifth embodiment of the disclosure. Referring to FIG. 7, a main difference between the display substrate 110d of the embodiment and the display substrate 110 of the first embodiment lies in the arrangement of the first filling positions 112b and the second filling position 114b in the splicing area. To be specific, in the embodiment, the peripherals of the first arranging area 111, the second arranging area 113, a third arranging area 115 and a fourth arranging area 117 are all surrounded by a splicing area 1120. Any two adjacent arranging areas (including the first arranging area 111, the second arranging area 113, the third arranging area 115 and the fourth arranging area 117) is configured with the splicing area 1120 there between. The splicing area 1120 is configured with one portion of the micro light-emitting elements 120 which transferring step is the same as the micro light-emitting elements 120 in one arranging area located at one side of the splicing area 1120, and the splicing area 1120 is configured with the other portion of the micro light-emitting elements 120 which transferring step is the same as the micro light-emitting elements 120 in the other arranging area located at the other side of the splicing area 1120. Namely, relative offsets of the micro light-emitting elements 120 and the conductive pads 131 in the splicing area 1120 are different.

Figure 8:
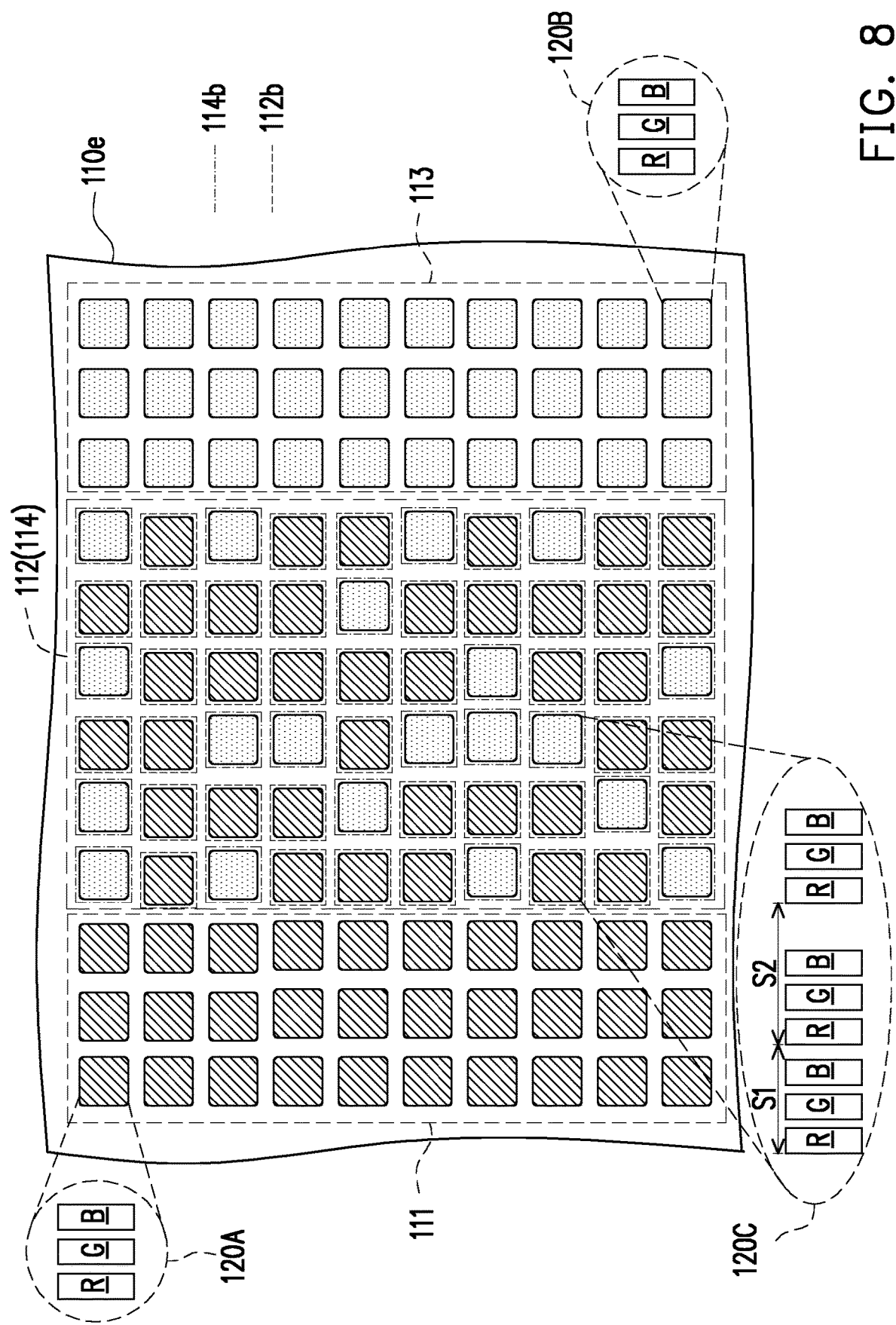
FIG. 8 is a partial top view of a display substrate according to a sixth embodiment of the disclosure.

FIG. 8 is a partial top view of a display substrate according to a sixth embodiment of the disclosure. Referring to FIG. 8, a main difference between the display substrate 110e of the embodiment and the display substrate 110 of the first embodiment lies a configuration pattern of a plurality of micro light-emitting elements. To be specific, in the embodiment, a plurality of the micro light-emitting elements are disposed on the display substrate 110e and respectively electrically bonded to the conductive pad pairs, wherein the micro light-emitting elements include a plurality of first color LEDs R, a plurality of second color LEDs G and a plurality of third color LEDs B. for example, the first color LED R, for example, emits red light, the second color LED G emits green light, and the third color LED B emits blue light, though the disclosure is not limited thereto.

According to FIG. 8, it is known that each of the micro light-emitting element areas 120A and each of the micro light-emitting element areas 120B respectively in the first arranging area 111 and the second arranging area 113 all have the aforementioned first color LED R, the second color LED G and the third color LED B. Meanwhile, a micro light-emitting element area 120C selected in the splicing area includes a plurality of micro light-emitting elements in two first filling positions 112b and one second filling position 114b on a same row of the splicing area.

Each of the first filling positions 112b and each of the second filling positions 114b are respectively configured with one first color LED R, one second color LED G and one third color LED B on three conductive pad pairs, and the first color LEDs R in the first filling positions 112b and the second filling positions 114b have different offsets with respect to the bonded conductive pad pairs.

Based on the above description, according to the plurality of micro light-emitting elements in the two first filling positions 112b and the second filling position 114b of the micro light-emitting element area 120C, it is known that since the first color LEDs R in the first filling positions 112b and the second filling position 114b have different offsets with respect to the bonded conductive pad pairs, a first interval S1 between the first color LED R of the micro light-emitting element in one of the two adjacent first filling positions 112b and the first color LED R of the micro light-emitting element in the other one of the two adjacent first filling positions 112b is different to a second interval S2 between the first color LED R of the micro light-emitting element in the first filling position 112b and the first color LED R of the micro light-emitting element in the second filling positions 114b adjacent to the first filling position 112b.

Meanwhile, it should be understood that an offset of the first color LED of any micro light-emitting element of the first arranging area 111 (for example, the first color LED R in the micro light-emitting element area 120A) with respect to the conductive pad pair bonded thereto is equivalent to an offset of the first color LED R of the micro light-emitting element in the first filling position 112b (for example, the first color LED R in any first filling position 112b in the micro light-emitting element area 120C) with respect to the conductive pad pair bonded thereto. Similarly, an offset of the first color LED of any micro light-emitting element of the second arranging area 113 (for example, the first color LED R in the micro light-emitting element area 120B) with respect to the conductive pad pair bonded thereto is equivalent to an offset of the first color LED R of the micro light-emitting element in the second filling position 114b (for example, the first color LED R in any second filling position 114b in the micro light-emitting element area 120C) with respect to the conductive pad pair bonded thereto.

Moreover, an interval between the first color LEDs of two adjacent micro light-emitting elements in the first filling positions 112b (for example, the first interval S1 between the first color LEDs R of the two adjacent first filling positions 112b in the micro light-emitting element area 120C) is different to an interval between the first color LEDs of two adjacent micro light-emitting elements of the second filling positions 114b respectively in the first arranging area 111 and the splicing area. Since the first color LEDs of the micro light-emitting elements in the first arranging area 111 and the first color LEDs of the first filling positions 112b in the splicing area are placed on the display substrate at the same time, it should be understood that the interval between the first color LEDs of two adjacent micro light-emitting elements in the first arranging area 111 and the second filling position of the splicing area is equivalent to the interval between the first color LEDs of two adjacent micro light-emitting elements of the adjacent first filling position 112b and the second filling position 114b of the splicing area (for example, the interval S2 between the first color LEDs R of the two adjacent first filling position 112b and the second filling position 114b in the micro light-emitting element area 120C).

In summary, in the manufacturing method of the micro LED display device of the disclosure, a transfer force is generated at a partial area of the transfer element to transfer the micro light-emitting elements with a specific number and distribution pattern, and a peripheral of the micro light-emitting elements in a prior transfer procedure is configured with vacancy positions for the micro light-emitting elements in a posterior transfer procedure to fill in. Therefore, the splicing area between any two adjacent arranging areas on the display substrate have the micro light-emitting elements with two different offsets. When the micro LED display device operates, the splicing area may provide a blurring effect, such that the splicing area between any two adjacent arranging areas would not produce an obvious boundary, so as to improve the display quality of the micro LED display device.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A manufacturing method of a micro LED display device, comprising:
    providing a display substrate comprising a plurality of conductive pad pairs arranged in an array;
    providing a carrier configured with a plurality of micro light-emitting elements;
    providing a transfer element; and
    transferring the micro light-emitting elements from the carrier to the display substrate through the transfer element, and electrically bonding the micro light-emitting elements to the conductive pad pairs,
    wherein in an nth transferring step, the transfer element is aligned with the carrier, and the transfer element generates a first pattern transfer area to transfer a part of the micro light-emitting elements in a region of the carrier to the display substrate according to the first pattern transfer area, and retain the other micro light-emitting elements in the region, and define a plurality of vacancy positions in a splicing area of the display substrate within a range corresponding to the region,
    in another transferring step, the transfer element is aligned with the carrier, and the transfer element generates a second pattern transfer area to transfer the micro light-emitting elements to the display substrate according to the second pattern transfer area to fill the vacancy positions defined in the nth of transfer,
    wherein n is a positive integer greater than or equal to 1,
    wherein the display substrate has a first arranging area, a first sub-splicing area connected to the first arranging area, a second arranging area and a second sub-splicing area connected to the second arranging area, and the first sub-splicing area and the second sub-splicing area are overlapped with each other to form the splicing area located between the first arranging area and the second arranging area,
    wherein the first pattern transfer area is corresponding to the first arranging area and the splicing area, and the second transfer area is corresponding to the second arranging area and the splicing area.

2. The manufacturing method of the micro LED display device as claimed in claim 1, wherein each of the conductive pad pairs has a reference line perpendicular to the display substrate, a sidewall of each of the micro light-emitting elements transferred to the display substrate in the nth transferring step and the reference line of the corresponding conductive pad pair are spaced by a first distance, and a sidewall of each of the micro light-emitting elements transferred to the display substrate in another transferring step and the reference line of the corresponding conductive pad pair are spaced by a second distance, wherein the second distance is different to the first distance.

3. The manufacturing method of the micro LED display device as claimed in claim 1, wherein the first pattern transfer area is matched with the second pattern transfer area.

* * * * *